(12) United States Patent
Laidig et al.

(10) Patent No.: US 7,485,396 B2
(45) Date of Patent: Feb. 3, 2009

(54) SCATTERING BAR OPC APPLICATION METHOD FOR SUB-HALF WAVELENGTH LITHOGRAPHY PATTERNING

(75) Inventors: Thomas Laidig, Point Richmond, CA (US); Kurt E. Wampler, Sunnyvale, CA (US); Douglas Van Den Broeke, Sunnyvale, CA (US); Jang Fung Chen, Cupertino, CA (US)

(73) Assignee: ASML Masktools B.V., AH Veldhoven (NL)

( * ) Notice: Subject to any disclaimer, the term of this patent is extended or adjusted under 35 U.S.C. 154(b) by 0 days.

(21) Appl. No.: 12/071,439

(22) Filed: Feb. 21, 2008

(65) Prior Publication Data

US 2008/0206656 A1 Aug. 28, 2008

Related U.S. Application Data

(62) Division of application No. 10/880,376, filed on Jun. 30, 2004, now Pat. No. 7,354,681.

(60) Provisional application No. 60/483,105, filed on Jun. 30, 2003, provisional application No. 60/500,272, filed on Sep. 5, 2003.

(51) Int. Cl.
*G03F 9/00* (2006.01)
(52) U.S. Cl. .............................. 430/5; 430/30
(58) Field of Classification Search ............... 430/5, 430/30
See application file for complete search history.

(56) References Cited

U.S. PATENT DOCUMENTS

| | | | |
|---|---|---|---|
| 5,242,770 A | 9/1993 | Chen et al. | |
| 5,256,505 A | 10/1993 | Chen et al. | |
| 5,300,379 A | 4/1994 | Dao et al. | |
| 5,302,477 A | 4/1994 | Dao et al. | |
| 5,340,700 A | 8/1994 | Chen et al. | |
| 5,354,632 A | 10/1994 | Dao et al. | |
| 5,424,154 A | 6/1995 | Borodovsky | |
| 5,447,810 A | 9/1995 | Chen et al. | |
| 5,498,579 A | 3/1996 | Borodovsky et al. | |
| 5,663,893 A | 9/1997 | Wampler et al. | |
| 5,821,014 A | 10/1998 | Chen et al. | |
| 5,881,125 A | 3/1999 | Dao | |
| 5,895,741 A | 4/1999 | Hasegawa et al. | |
| 6,074,787 A | 6/2000 | Takeuchi | |
| 6,373,553 B1 | 4/2002 | Singh | |
| 6,458,495 B1 | 10/2002 | Tsai et al. | |
| 6,479,195 B1 | 11/2002 | Kirchauer et al. | |
| 6,553,562 B2 | 4/2003 | Capodieci et al. | |
| 6,562,522 B1 | 5/2003 | Yan | |
| 6,625,802 B2 | 9/2003 | Singh et al. | |
| 6,627,362 B2 | 9/2003 | Stivers et al. | |
| 6,632,576 B2 | 10/2003 | Tejnil | |
| 6,660,649 B2 | 12/2003 | Dao et al. | |
| 6,670,081 B2 | 12/2003 | Laidig et al. | |
| 2002/0142597 A1 | 10/2002 | Park et al. | |
| 2003/0170572 A1 | 9/2003 | Yan | |

FOREIGN PATENT DOCUMENTS

WO WO 02/086627 A1 10/2002

OTHER PUBLICATIONS

Liebmann et al., "Optimizing Style Options for Sub-Resolution Assist Features," Optical Microlithography XIV, Christopher J. Progler Proceedings of SPIE, vol. 4346 (2001), pp. 141-152.
European Search Report issued in European Patent Application No. EP 04253957.7-2222, dated Mar. 7, 2008.

*Primary Examiner*—Christopher G Young
(74) *Attorney, Agent, or Firm*—Mark J. Danielson; Pillsbury Winthrop Shaw Pittman

(57) ABSTRACT

A method of forming a mask having optical proximity correction features, which includes the steps of obtaining a target pattern of features to be imaged, expanding the width of the features to be imaged, modifying the mask to include assist features which are placed adjacent the edges of the features to be imaged, where the assist features have a length corresponding to the expanded width of the features to be imaged, and returning the features to be imaged from the expanded width to a width corresponding to the target pattern.

12 Claims, 17 Drawing Sheets

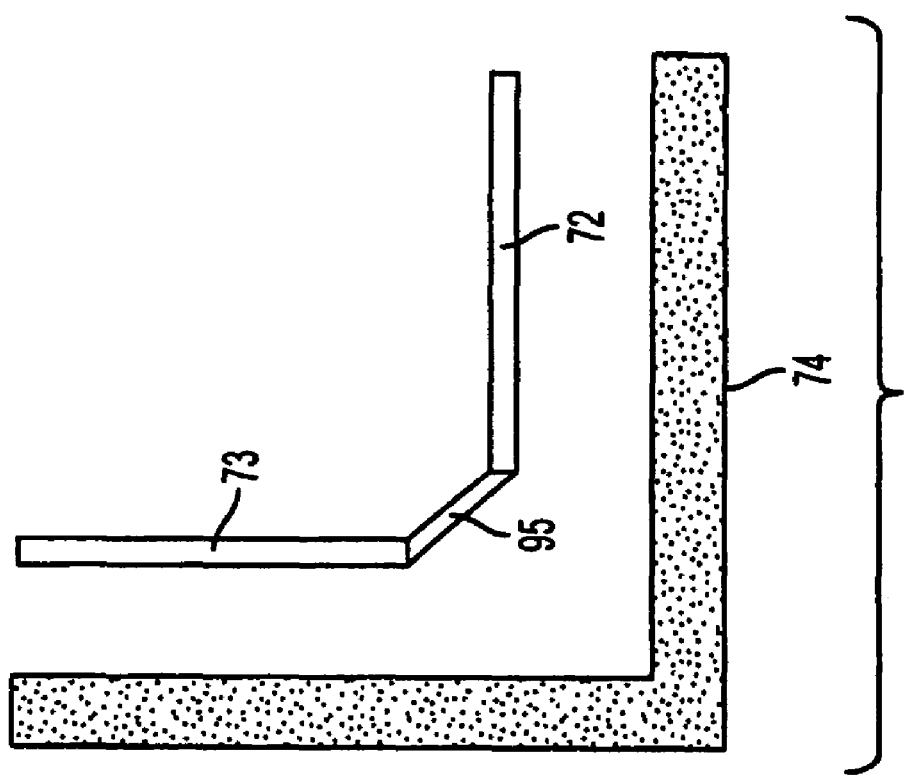
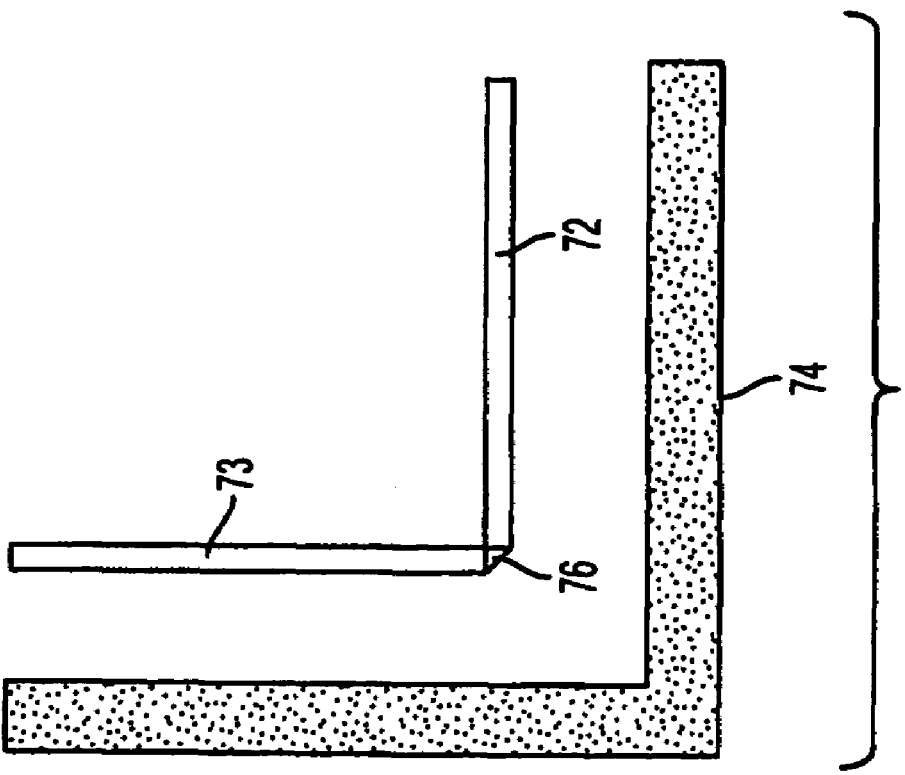

SCATTERING BAR OPC APPLICATION METHOD FOR SUB-HALF WAVELENGTH LITHOGRAPHY PATTERNING

CLAIM OF PRIORITY

This application is a Divisional of U.S. application Ser. No. 10/880,376, filed Jun. 30, 2004 now U.S. Pat. No. 7,354,681, claiming priority from U.S. provisional application No. 60/483,105, entitled "A Method For Compensating For Scattering Bar Loss," filed Jun. 30, 2003; and from U.S. provisional application No. 60/500,272, entitled "Improved Scattering Bar OPC Application Method For Sub-Half Wavelength Lithography Patterning," filed Sep. 5, 2003, the entire contents of each of which are hereby incorporated by reference.

FIELD OF THE INVENTION

The present invention relates to photolithography, and in particular to an improvement in optical proximity correction (OPC) by utilizing an improved scattering bar/assist feature design, as well as a new method for implementing scattering bars in a mask design.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or the smallest space between two lines. Thus, the CD determines the overall size and density of the designed circuit.

Of course, one of the goals in integrated circuit fabrication is to faithfully reproduce the original circuit design on the wafer (via the mask). Currently, various optical proximity correction (OPC) techniques are utilized to allow the resulting image to more accurately correspond to the desired target pattern. A common OPC technique, which is widely known, is the use of subresolution scattering bars (also referred to as assist features). As described, for example, in U.S. Pat. No. 5,821,014, sub-resolution assist features, or scattering bars, are used as a means to correct for optical proximity effects and have been shown to be effective for increasing the overall process window (i.e., the range of focus and exposure dose variation over which features having some specified CD can be printed consistently, regardless of whether or not the features are isolated or densely packed relative to adjacent features). As set forth in the '014 patent, generally speaking, the optical proximity correction occurs by improving the depth of focus for the less dense to isolated features by placing scattering bars near these features. The scattering bars function to change the effective pattern density (of the isolated or less dense features) to be more dense, thereby negating the undesirable proximity effects associated with printing of isolated or less dense features. It is important, however, that the scattering bars themselves do not print on the wafer. Thus, this requires that the size of the scattering bars must be maintained below the resolution capability of the imaging system.

Notwithstanding the wide-spread use of scattering bars, there remains essentially three issues with current scattering bar technology when utilized for patterning feature dimensions at half or below the exposure wavelength. The first issue relates to inadequate protection for the main design features that severely limits focus range. The second issue relates to the fact that in a typical scattering bar solution, too many short pieces of scattering bars are generated which results in excessive demands on mask making capabilities. The third issue relates to the fact that there is no adequate solution for adjacent horizontal and vertical scattering bars to be joined together. Current methods require that the horizontal and vertical scattering bars be pulled apart from one another.

FIGS. 1a-1c illustrate the first issue noted above. FIG. 1a illustrates an exemplary layout having both features to be printed 12 and scattering bars 13 which perform OPC. FIGS. 1b and 1c illustrate the resulting printing performance at "best focus" and a defocus of 0.1 um. As shown in FIG. 1c, which has a portion of the resulting pattern encircled which corresponds to the encircled portion of the mask of FIG. 1a, the areas 14 of features 12 which do not have any vertically positioned scattering bars adjacent thereto exhibit "pinching" (i.e., a undesirable reduction in the width of the line to be printed).

FIG. 2 illustrates the second issue noted above. More specifically, FIG. 2 illustrates a mask (also referred to herein as mask layout) modified to include scattering bars utilizing currently known techniques for scattering bar application. The mask includes both features 12 to be printed and scattering bars 13. As shown in FIG. 2, current techniques result in an excessive number of short pieces of scattering bars 15 in the mask layout. However, due to mask making process limitations, many of these short pieces of scattering bars must be eliminated, thereby undesirably reducing printing performance.

FIG. 2 also illustrates the third issue noted above. As shown, none of the vertical and horizontal scattering bars 13 located proximate one another are connected to one another. This is due to the fact that current techniques for placing scattering bars within a mask design require that vertical and horizontal scattering bars, for example, which are adjacent a corner of a feature to be printed, be pulled apart from one another so as to prevent imaging of the intersecting portion of the scattering bars. However, as noted above, the elimination of scattering bar portions from the mask results in an undesirable reduction in printing performance.

Thus, there exists a need for a method of providing sub-resolution scattering bars (also referred to as assist features) in a mask which overcomes the foregoing problems so as to allow for improved OPC and printing performance.

The following description discusses novel methods for applying scattering bars to a mask layout.

SUMMARY

In an effort to solve the aforementioned needs, it is an object of the present invention to provide a method and technique for modifying a mask to include scattering bars, which decreases the amount of individual scattering bars included in the layout design, while increasing the overall area occupied by the scattering bars. The method of the present invention also allows for the use of a novel "chamfer" scattering bar which allows for the connection of adjacent vertical and horizontal scattering bars and thereby provides improved printing performance of corner features contained in the mask, as well as full protection (i.e., completely surrounded by scattering bars) of isolated features.

More specifically, the present invention relates to a method of modifying a mask to include optical proximity correction features, which includes the steps of obtaining a target pattern of features to be imaged; expanding the width of the features to be imaged; modifying the mask to include assist features which are placed adjacent the edges of the features to be imaged, where the assist features have a length corresponding to the expanded width of the features to be imaged, and returning the features to be imaged from the expanded width to a width corresponding to the target pattern. The resulting modified mask layout comprises the combination of the assist features and the features to be imaged having a width corresponding to the target pattern.

The present invention also relates to a method of forming a mask comprising features to be imaged and optical proximity correction features. The method comprises the steps of forming a first assist feature extending in a vertical direction; forming a second assist feature extending in a horizontal direction; and forming a chamfer assist feature which connects the first assist feature to the second assist feature, where the chamfer assist feature is disposed at an angle relative to both the first assist feature and the second assist feature.

The present invention provides numerous advantages over the prior art techniques. One advantage is that the technique of the present invention decreases the amount of individual scattering bars included in the mask design, and increases the overall area occupied by the scattering bars. In addition, the method of the present invention provides for placement of scattering bars at line ends, which would be omitted utilizing prior art techniques. This results in a simplification of the mask making process, while simultaneously improving printing performance. The method also allows for the use of a novel "chamfer" scattering bar which allows for the connection of adjacent vertical and horizontal scattering bars and thereby provides improved printing performance of corner features contained in the layout, as well as full protection (i.e., completely surrounded by scattering bars) of isolated features. This complete surround assures that all parts of these design features receive the depth of focus improvement that scattering bars are known to provide to isolated features.

The foregoing and other features, aspects, and advantages of the present invention will become more apparent from the following detailed description of the present invention when taken in conjunction with the accompanying drawings.

BRIEF DESCRIPTION OF THE DRAWINGS

FIGS. 13a and 13b illustrate how the chamfer scattering bar of the present invention can be adjusted to optimize printing performance.

DESCRIPTION

In accordance with the optical proximity correction technique of the present invention, there is provided a method and technique for modifying a mask layout to include scattering bars, which increases the amount of scattering bars included in the mask design, while minimizing the number of individual pieces of scattering bars. The method also allows for the use of a novel "chamfer" scattering bar which allows for the connection of adjacent vertical and horizontal scattering bars and thereby provides improved printing performance of corner features contained in the layout, as well as full protection (i.e., completely surrounded by scattering bars) of isolated features.

Figure 3:
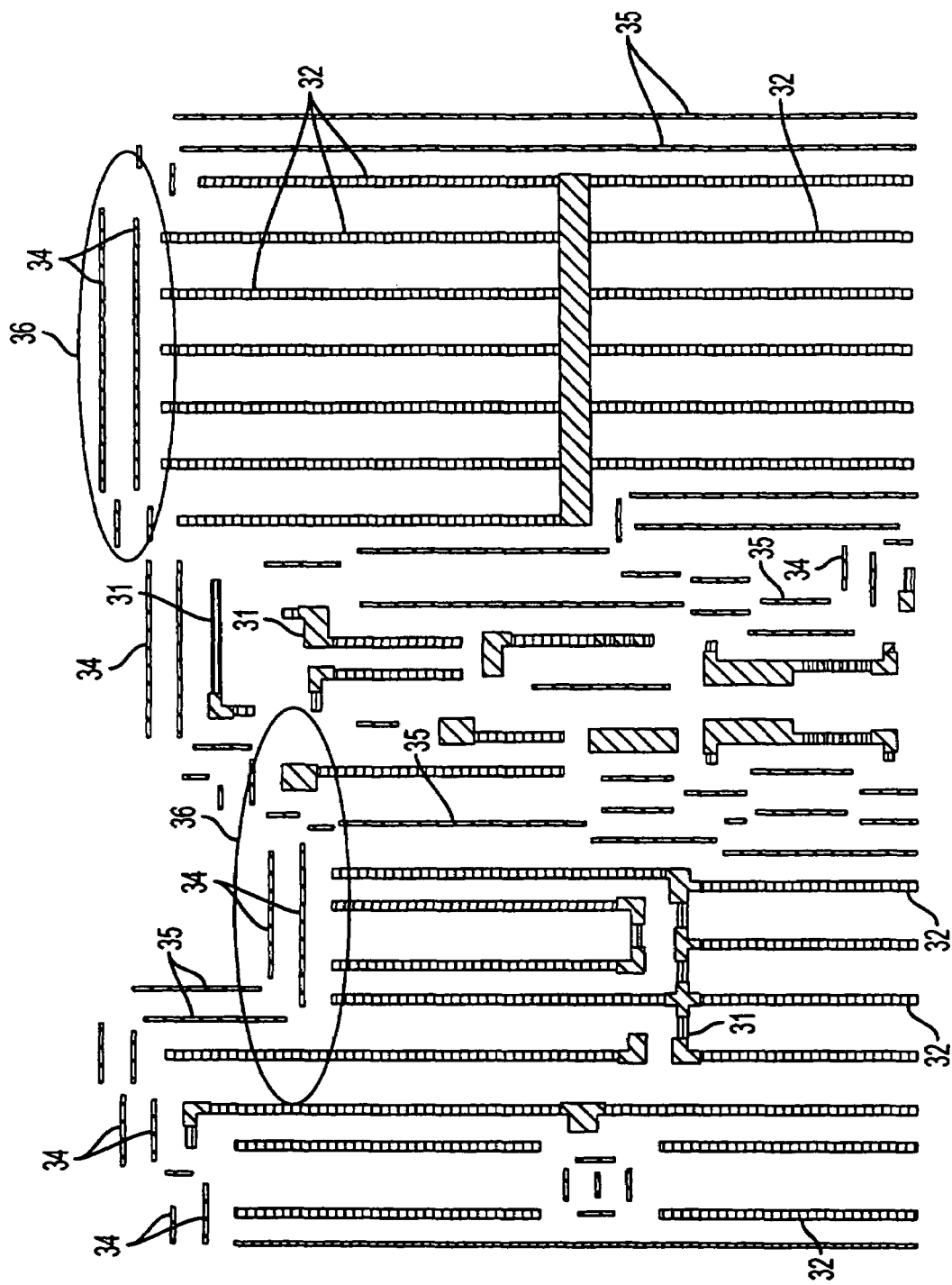
FIG. 3 illustrates an exemplary mask layout modified to include scattering bars utilizing the method of the present invention.

FIG. 3 illustrates an exemplary mask layout modified to include scattering bars utilizing the method of the present invention, which is referred to as the "scattering bar extension method". Referring to. FIG. 3, the mask layout includes horizontal features 31 and vertical features 32, which are printed on the substrate, as well as horizontal scattering bars 34 and vertical scattering bars 35. As noted above, the dimensions of scatterings bars 34 and 35 are such that the scattering bars remain subresolution, and do not print on the imaged substrate.

Figure 2:
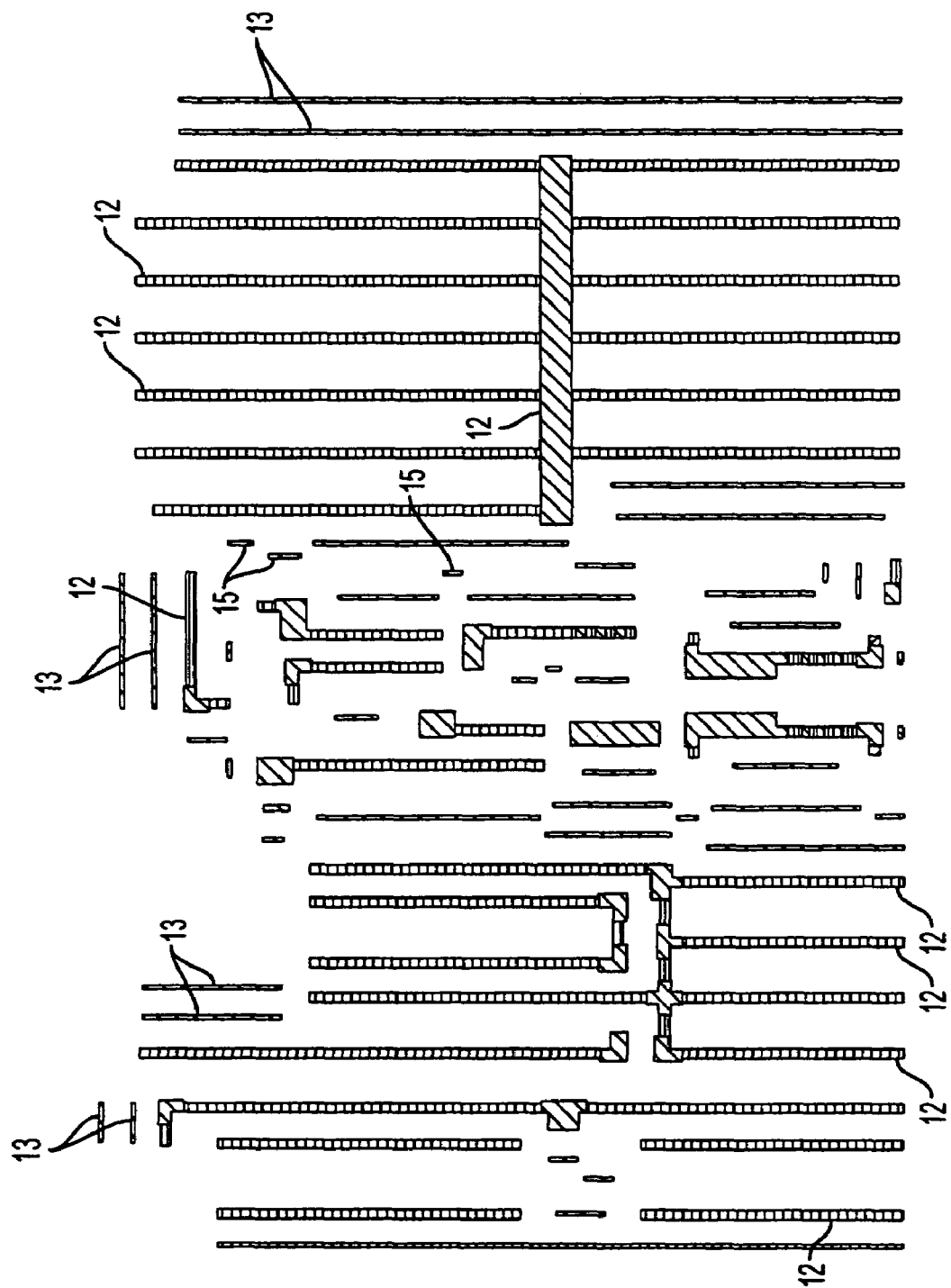
FIG. 2 illustrates an exemplary mask layout modified to include scattering bars utilizing currently known methods of applying scattering bars to a mask layout.

As shown, when utilizing the scattering bar extension method of the present invention, which will be described in detail below, the resulting mask layout includes significantly more scattering bars than compared to prior art methods. This is clear from a comparison of FIG. 2 and FIG. 3. It is noted that FIG. 3 illustrates the same underlying pattern to be imaged as FIG. 2. Indeed, application of scatterings bars in accordance with the present invention results in the placement of scattering bars in areas which would not contain scattering bars if the scattering bars were applied utilizing prior art methods. For example, referring to portions 36 of the mask layout, as shown in FIG. 3, horizontally positioned scattering bars 34 are positioned adjacent line ends of vertically positioned lines 32 utilizing the novel process. However, in contrast, when utilizing prior art methods, no such horizontal scattering bars would be placed adjacent the vertical line ends, as the width of the vertical line end would be deemed to small too warrant placement of a scattering bar adjacent thereto.

Figure 4:
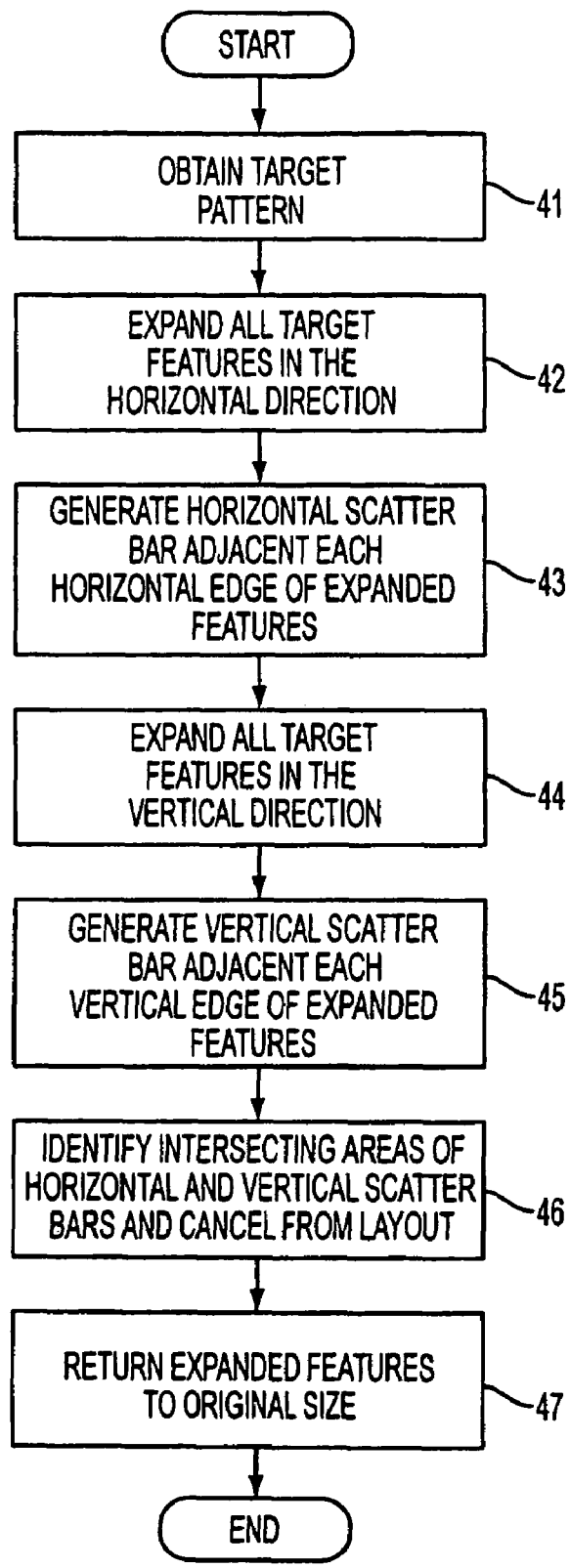
FIG. 4 is an exemplary flow chart which sets forth the method of applying scattering bars to a mask layout in accordance with the present invention.
Figure 5A:
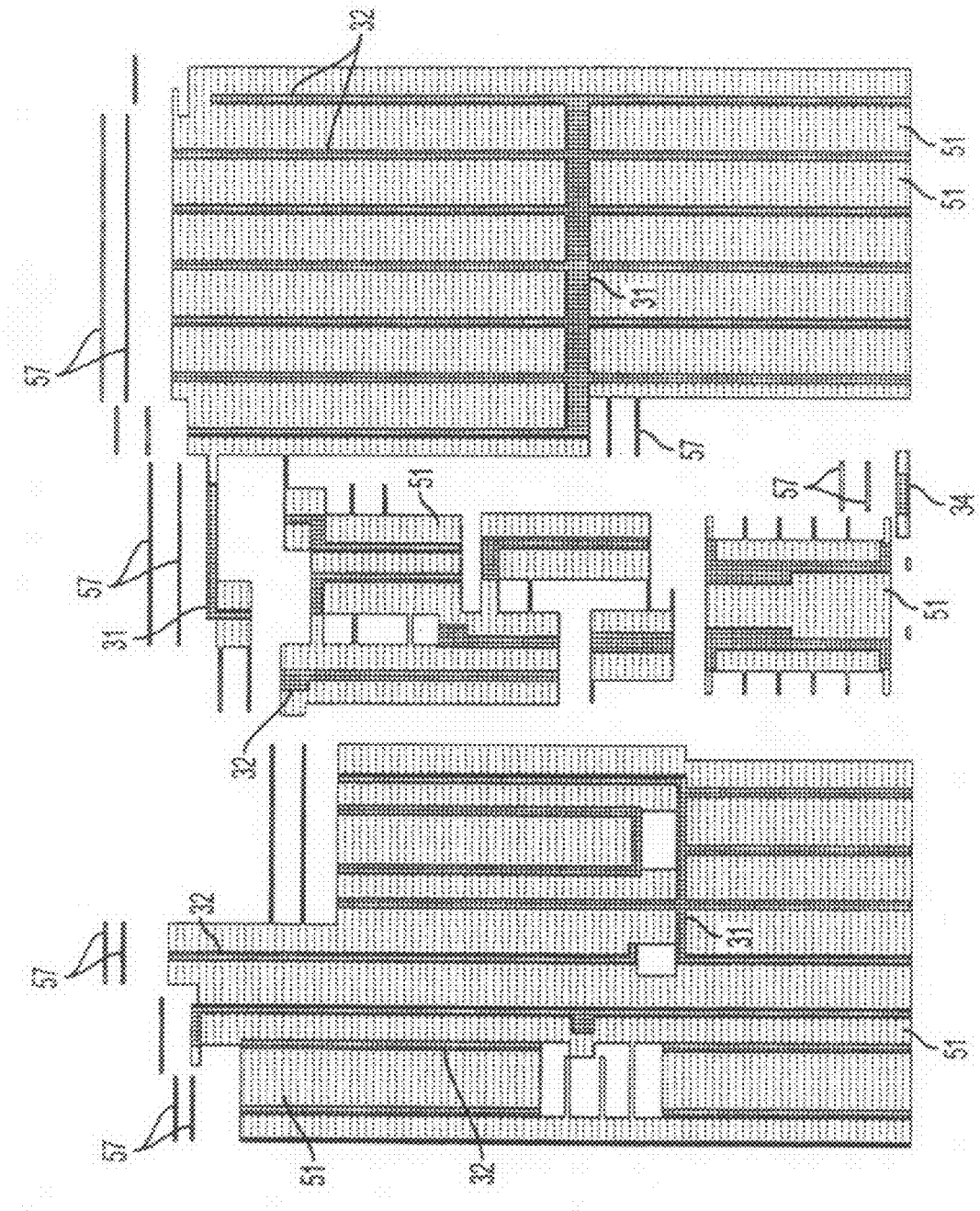
FIGS. 5a-5c illustrate the process described in the flowchart of FIG. 4.
Figure 5B:
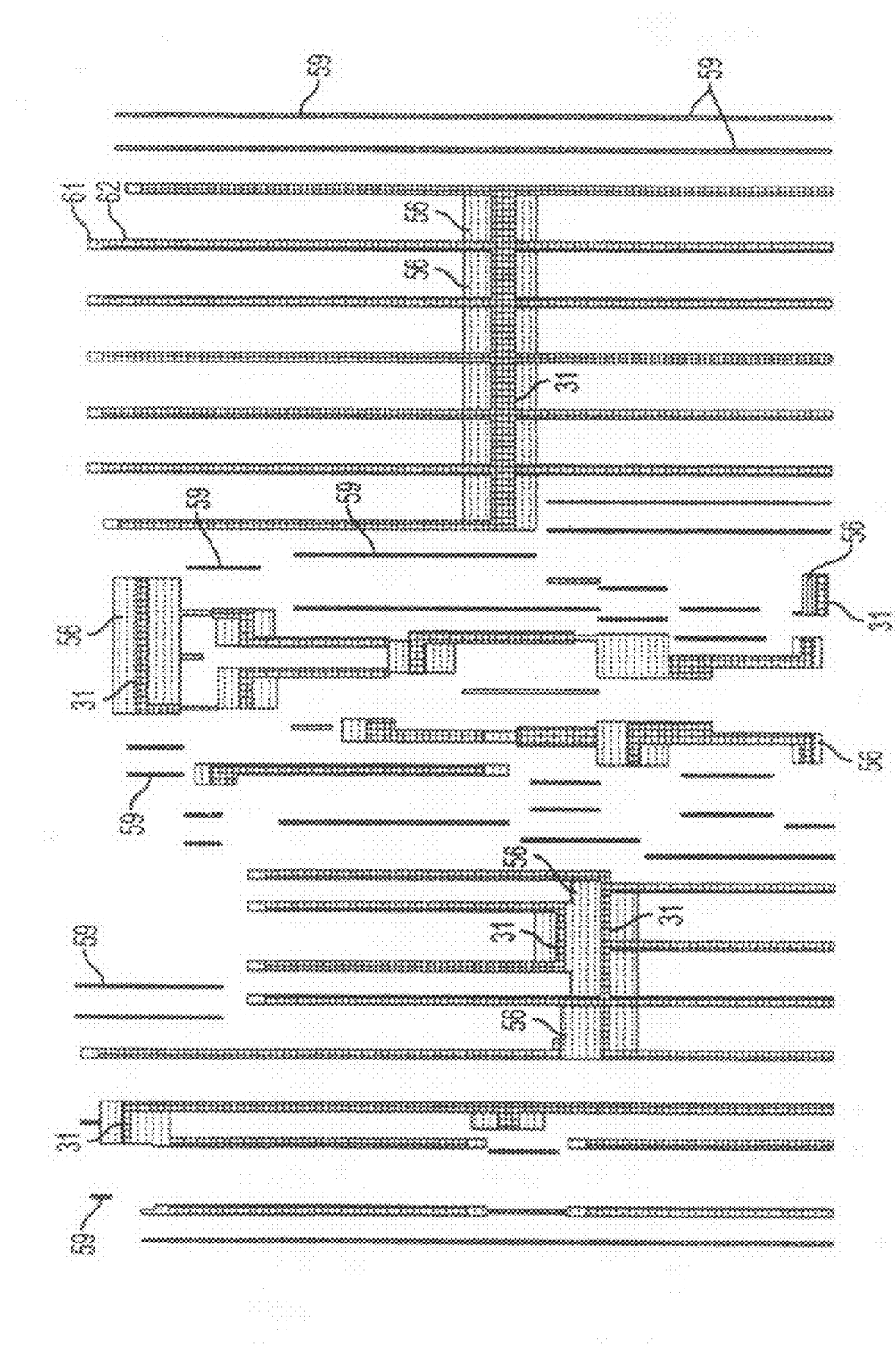
Figure 5C:
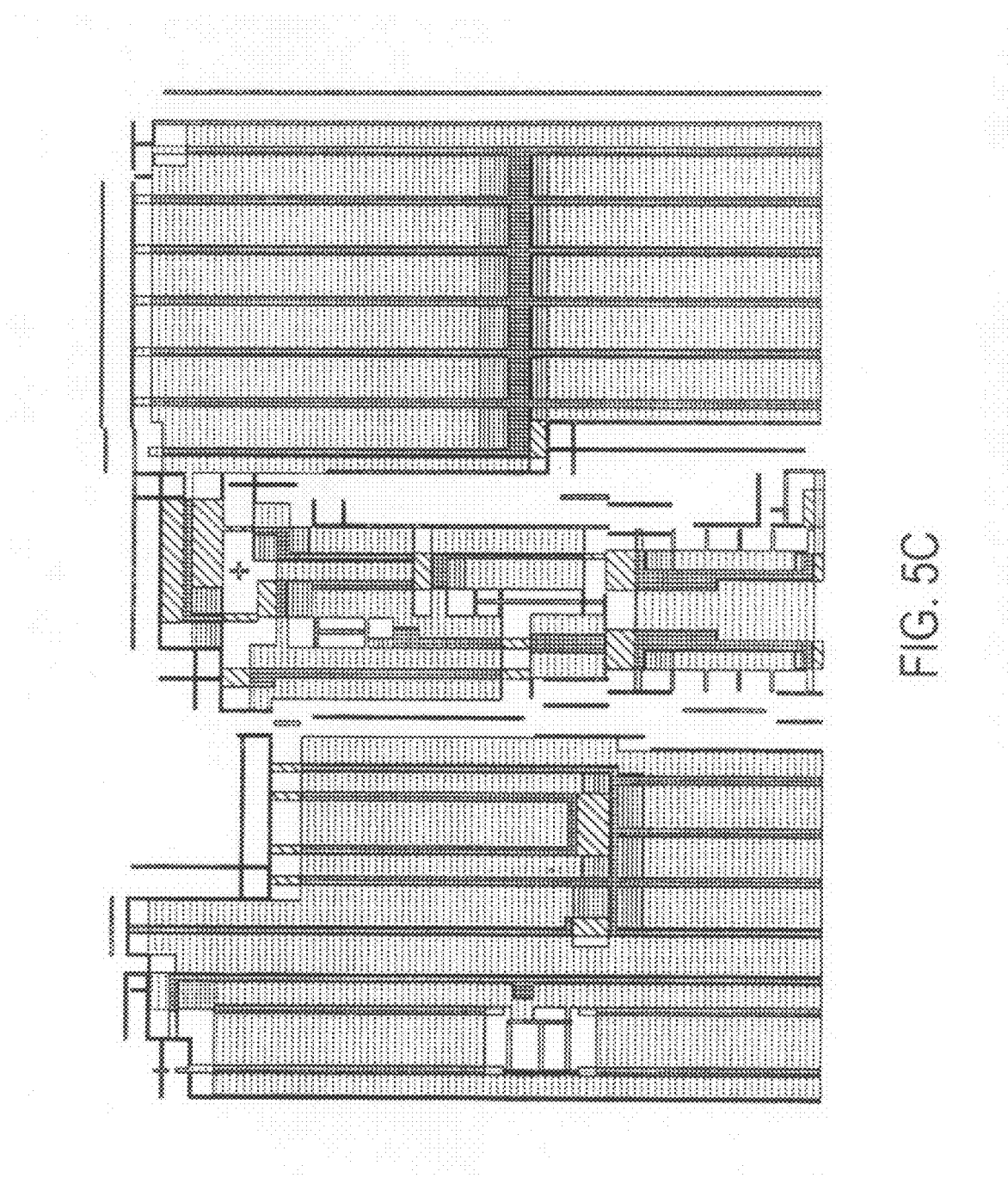

FIG. 4 is an exemplary flow chart which sets forth the method of applying scattering bars to a mask layout in accordance with the present invention, and FIGS. 5a-5c illustrate the process of FIG. 4. Referring to FIG. 4, the first step 41 is to obtain the desired pattern (i.e., target pattern) to be imaged on the substrate. As shown, the target pattern contains both vertical features 32 and horizontal features 31 (it is noted that to the extent features are referred to as vertical or horizontal features herein it is for the sake of simplicity when referencing two sets of features which extend orthogonal to one another). The next step 42 is expand all features in the horizontal direction, lengthening their horizontal edges. Any features sufficiently close together in this direction will then merge. The enlarged area of the horizontally-extended features is indicated by reference numeral 51 in FIG. 5a. The amount that the features are horizontally expanded in step 42 determines how far scattering bars will extend beyond the ends of horizontal edges of the target pattern, and at what maximum horizontal separation features will be merged. In the given embodiment, this distance is selected to be approximately equal to the distance between a primary feature and its scattering bar (the distance to the closest scattering bar, if multiple scattering bars are placed adjacent an edge). This criteria causes scattering bars at a convex corner to extend to a 45 degree angle outward. Beyond that, the resulting horizontal scattering bar would be closer to a vertical edge than a horizontal edge, where a vertical scattering bar would be more useful. It is also noted that, as shown in FIG. 5a, the horizontally-extended features exhibit an extended horizontal edge surface. The next step 43 is to generate horizontal scattering bars 57 adjacent each horizontal edge of the expanded features. In other words, the mask pattern is modified to include horizontal scattering bars 57 placed adjacent horizontal feature edges.

Once the horizontal scattering bars have been generated, the next step in the process is to generate vertical scattering bars 59 to be placed adjacent the vertical feature edges in a similar manner. Referring again to FIG. 4, the first step 44 is to expand each feature in the vertical direction. In the given embodiment, features sufficiently close in the vertical direction are expanded such that they join neighboring features. The enlarged areas of the features are indicated by reference numeral 56 in FIG. 5b. It is noted that the amount of increase in the vertical dimension of the features is limited in the same manner as the horizontal extension described above (i.e., in the given embodiment, the amount of the extension is chosen to be the distance between a primary feature and an adjacent scattering bar. It is also noted that, as shown in FIG. 5b, the extended features exhibit an extended vertical edge surface. The next step 45 is to generate vertical scattering bars 59 adjacent each vertical edge of the vertically expanded features. In other words, the mask pattern is modified to include vertical scattering bars placed adjacent vertical feature edges.

It is further noted that in the given embodiment, when expanding the vertical and horizontal features, as shown in FIGS. 5a and 5b, each vertical edge and horizontal edge is expanded in the respective steps (not simply features that would be deemed predominantly vertical or horizontal). For example, referring to FIG. 5b, the horizontal edge 61 of the vertical feature 62 is extended during the expansion step. This subsequently results in the placement of an extended scattering bar adjacent the vertical feature 61. All vertical edges are expanded in a similar manner during step 42 as shown in FIG. 5*a*, which results in the placement of an extended scattering adjacent the horizontal feature 34.

Once step 45 is completed, in step 46, referring to FIG. 5*c*, the mask layout having both extended vertical scattering bars and extended horizontal scattering bars are examined to determine any area in which the vertical scattering bars and the horizontal scattering bars interest (i.e., overlap) one another, and all of the intersecting areas are cancelled from the mask layout. In the final step of the process (step 47), the expanded vertical and horizontal features are returned to their original size. Thus, after the foregoing process, the mask layout contains the original target pattern modified to include the extended vertical and horizontal scattering bars. FIG. 5*c* illustrates the modified mask layout prior to cancellation of the intersecting areas.

Figure 6:
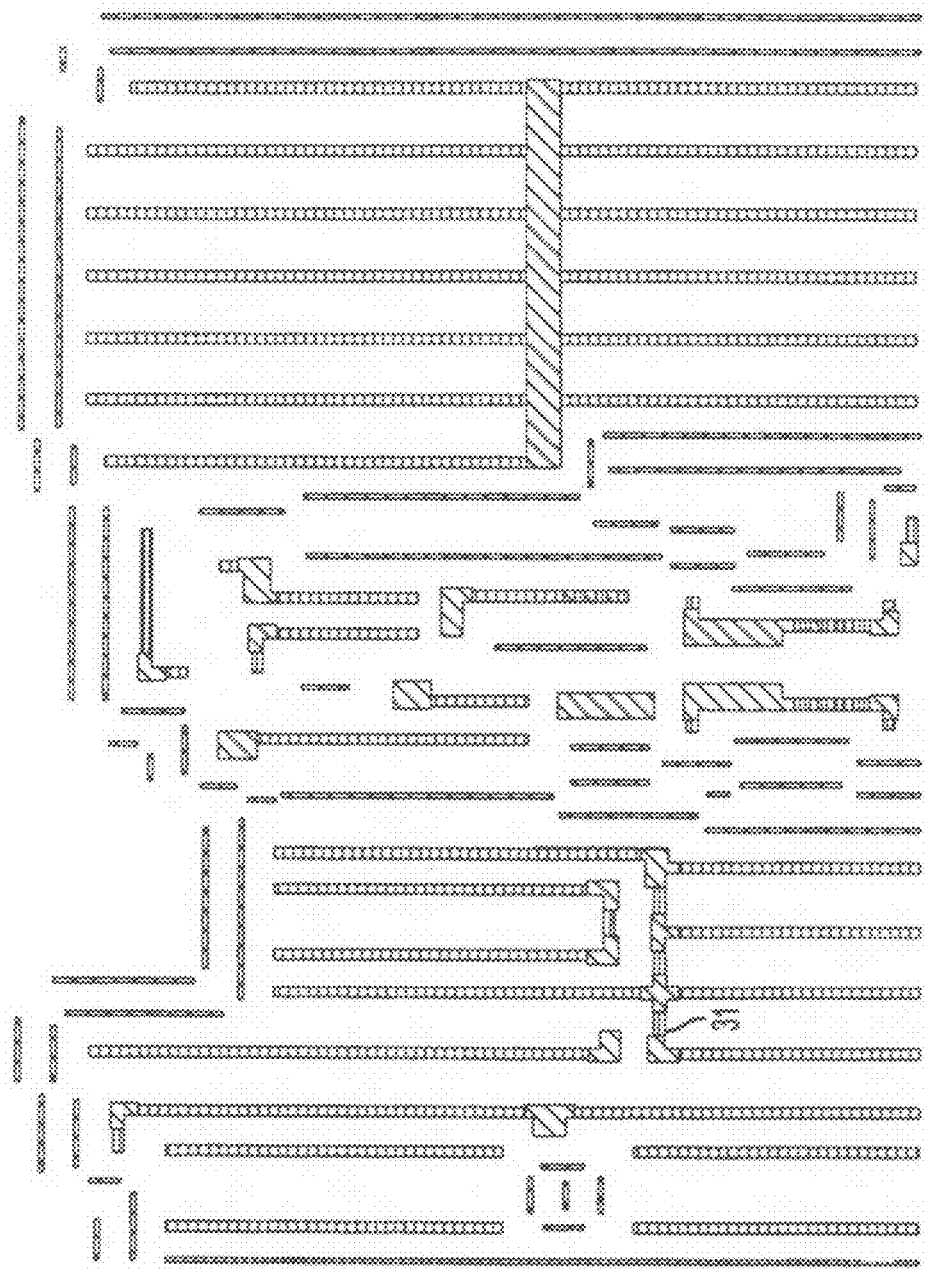
FIG. 6 illustrates the mask layout after completion of the scattering bar application process in accordance with the present invention.
Figure 7:
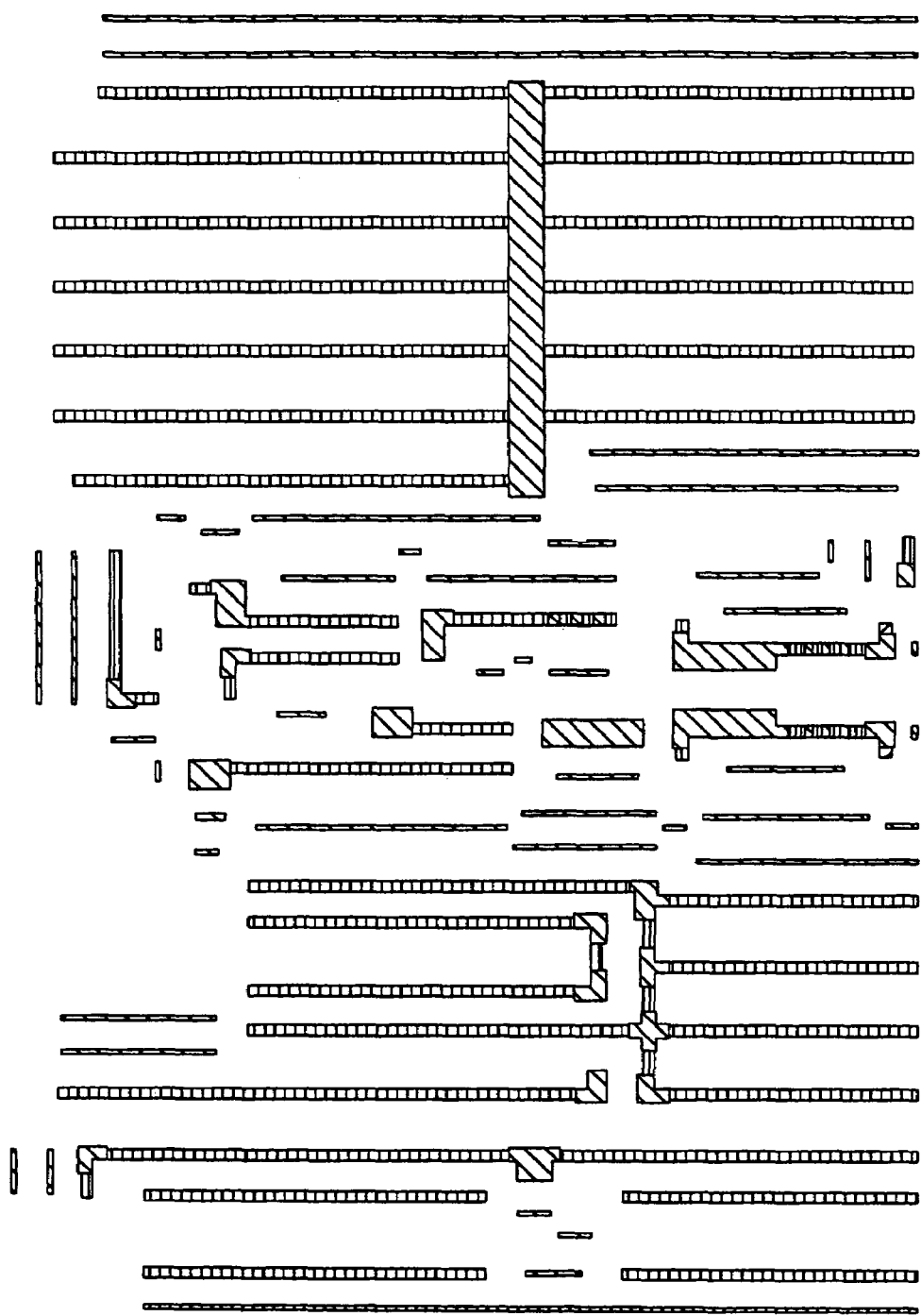
FIG. 7 illustrates the application of scattering bars to the same target pattern shown in FIG. 6 utilizing prior art scattering bar techniques.

FIG. 6 illustrates the mask layout after completion of the foregoing scattering bar application process in accordance with the present invention. FIG. 7 illustrates the application of scattering bars to the same target pattern shown in FIG. 6 utilizing prior art scattering bar techniques. As can be seen by a comparison of the drawings, the new scattering bar extension method results in scattering bar placement in areas not corrected utilizing prior art techniques. The new method also results in a reduction in the number of individual scattering bar segments included in the mask design (i.e., many of the smaller, individual scattering bar designs are replaced with a single, continuous scattering bar). It is noted that the bottom portions of FIGS. 5*a*-5*c* and 6 do not represent the end of the mask pattern shown in these figures (i.e., only a portion of the entire target pattern is illustrated). If the bottom portion of these figures corresponded to the actual end of the target pattern, scattering bars would also be placed adjacent thereto. As explained further below, it also possible to connect such adjacent vertical and horizontal scattering bars, which are created by the removal of the intersecting areas, utilizing a novel "chamfer" scattering bar as illustrated in FIGS. 13*a* and 13*b*.

The method of the present invention also entails utilizing novel "chamfer connection style" scattering bars, which allow for connection between the ends of adjacent vertical and horizontal scattering bars (i.e., via the chamfer scattering bar). As discussed below, the chamfer scattering bar eliminates the problems associated with utilizing scattering bars adjacent corner features of target patterns.

Figure 1C:
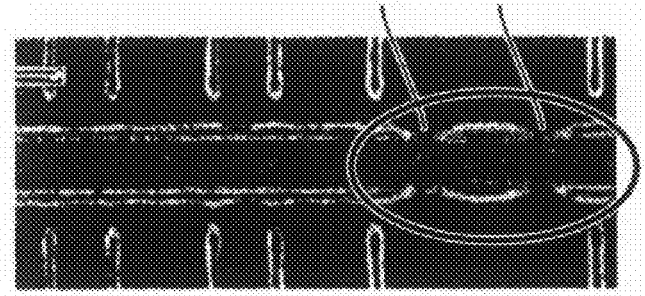
FIGS. 1a-1c illustrate problems resulting from the application of scattering bars utilizing currently known methods of applying scattering bars to a mask design.
Figure 1B:
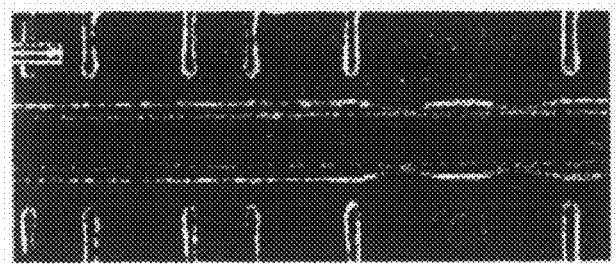
Figure 1A:
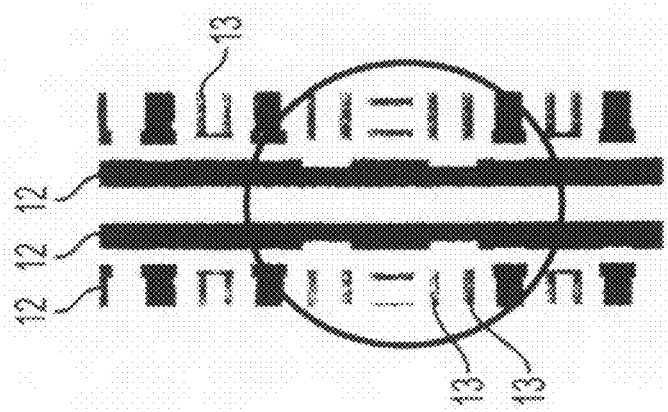
Figure 8:
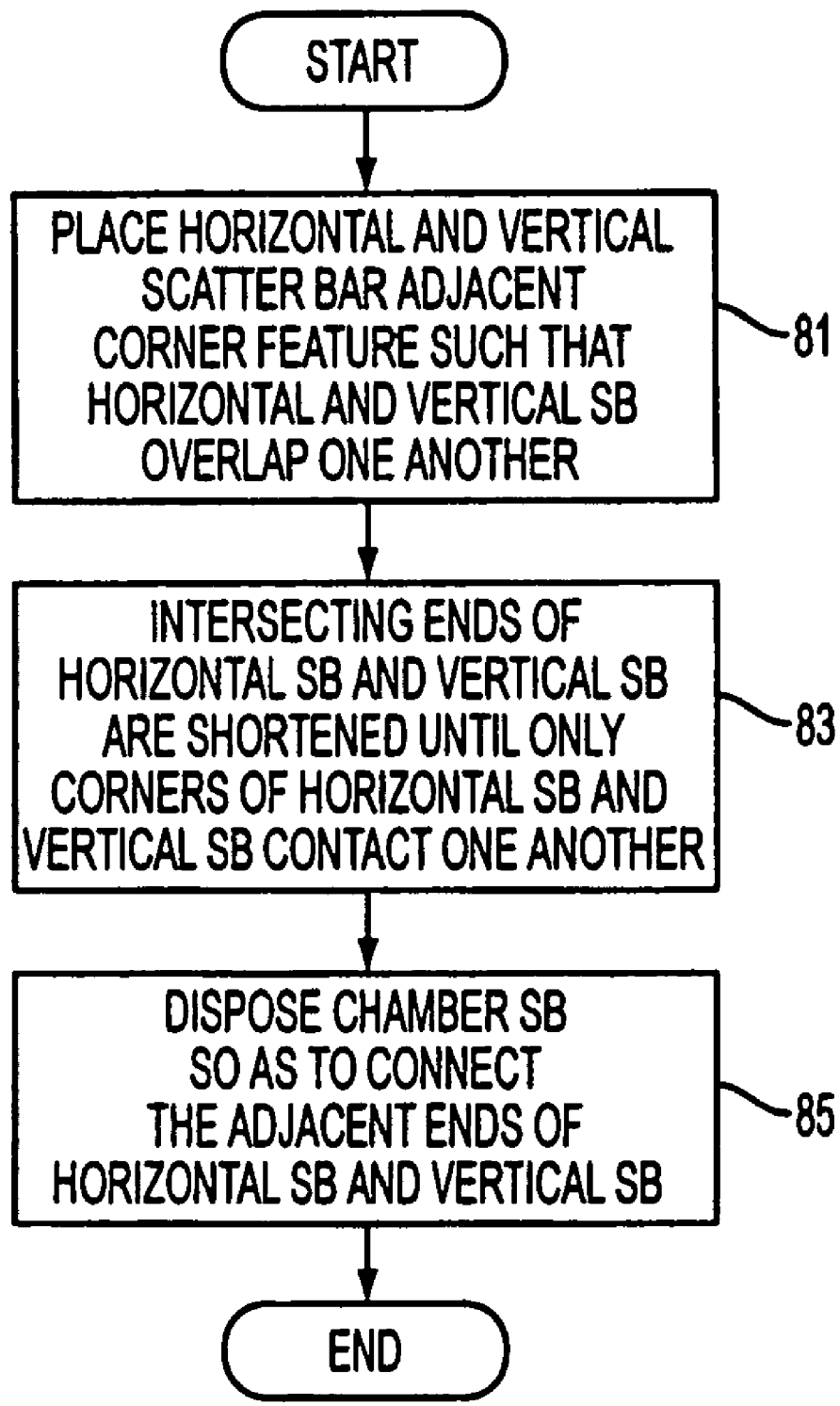
FIG. 8 is a flow chart of an exemplary method of generating the "chamfer" scattering bar in accordance with the present invention.
Figure 10:
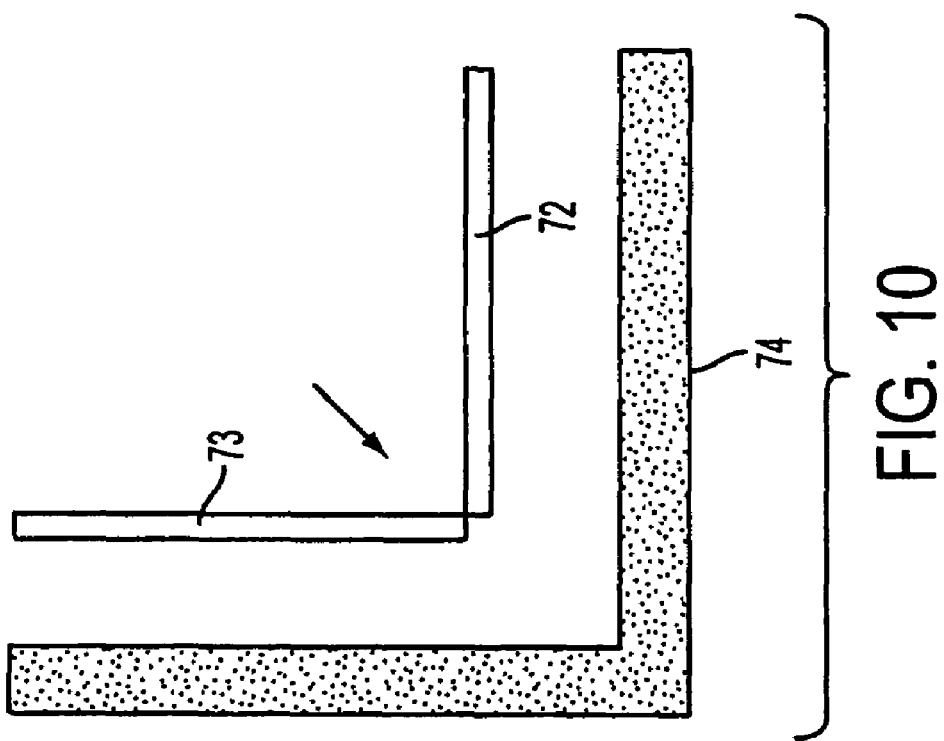
FIGS. 9-11 illustrate the process described in the flowchart of FIG. 8.
Figure 9:
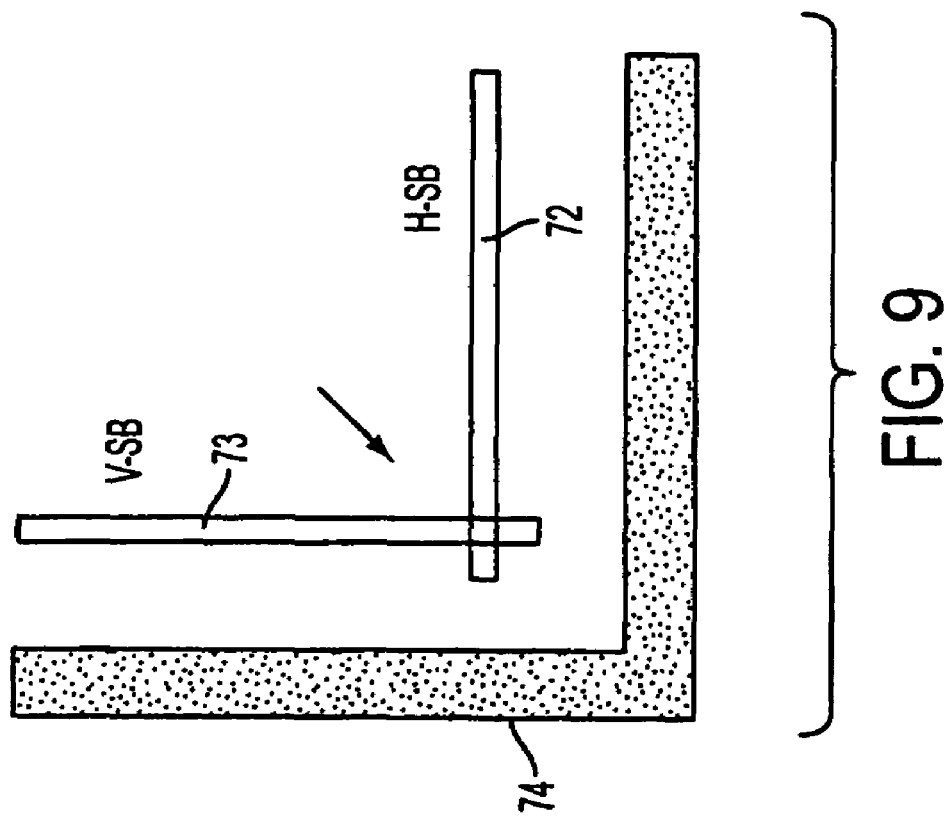
Figure 11:
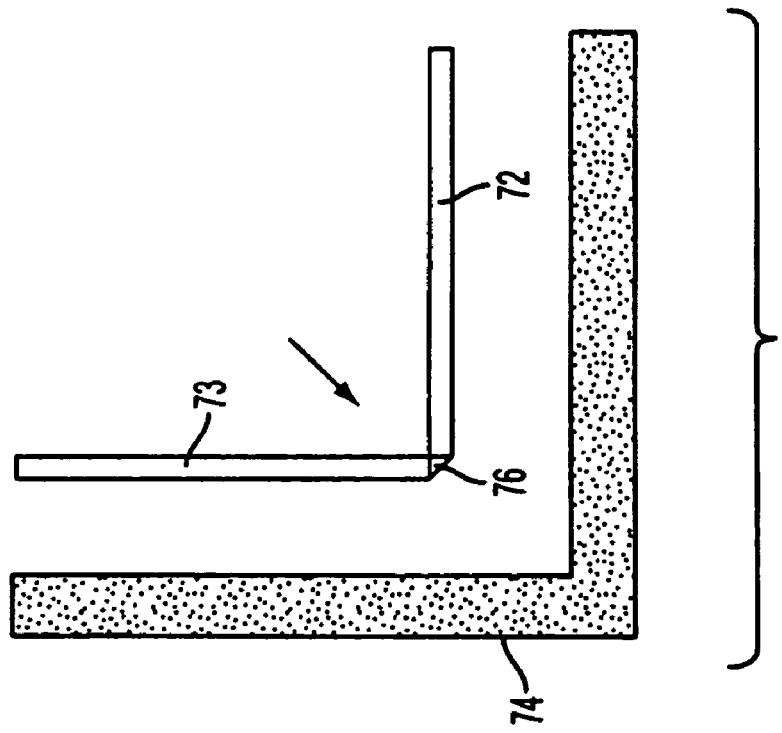

FIG. 8 is a flow chart describing an exemplary method of generating the "chamfer" scattering bar in accordance with the present invention. Referring to FIGS. 9-11, which illustrate the process, the first step 81 is to place both a horizontal scattering bar 72 and a vertical scattering bar 73 adjacent a corner feature 74 of the target pattern such that the horizontal and vertical scattering bars 72 and 73 intersect with one another as shown in FIG. 9. In the next step (step 83), the intersecting ends of the horizontal and vertical scattering bars 72 and 73 are pulled back from one another such that two corners of the horizontal and vertical scattering bars contact one another as shown in FIG. 10. In the next step (Step 85), a triangular shaped feature 76 (i.e., the chamfer scattering bar) is placed in contact with both the edge of the horizontal and vertical scattering bars 72 and 73 such that the face of the chamfer scattering bar 76 exposed to the corner feature forms a substantially 45° angle with the horizontal and vertical scattering bars 72 and 73 as shown in FIG. 1. It is noted that in the given embodiment, the chamfer scattering bar essentially forms a triangle feature having angles of 45°, 45° and 90°. It is further noted that the chamfer scattering bar is substantially less likely to print as compared to horizontal and vertical scattering bars which are allowed to intersect adjacent a corner region of a feature (which typically result in the printing of an undesirable blob at the point of intersection).

It is also noted that while the chamfer scattering bar disclosed in the given embodiment exhibits a right triangle configuration have equal angles of 45°, it is not necessarily limited to such a configuration. As described below, the chamfer scattering bar is capable of other configurations, each of which can be selected and optimized for a given process and a given target pattern layout. One of the main aspects is that the chamfer scattering bar exhibits a reduction in the area of the scattering bar in comparison to the square area that is formed/defined by the intersection of the vertical and horizontal scattering bars.

Figure 12A:
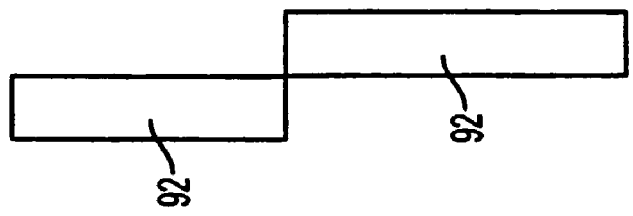
FIG. 12a illustrates the use of the novel chamfer scattering bar of the present invention to connect two parallel scattering bar lines extending in the same direction.
Figure 12B:
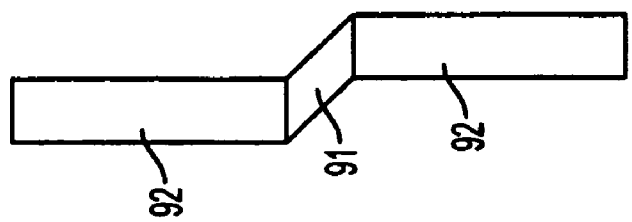
FIG. 12b illustrates how the parallel scattering bars are connected utilizing prior art techniques.

FIG. 12*a* illustrates the use of the novel chamfer scattering bar to connect two parallel scattering bar lines extending in the same direction. In contrast, FIG. 12*b* illustrates how the such parallel scattering have been connected utilizing prior art techniques. As shown in FIG. 12*a*, the chamfer 91 is configured as a parallelogram having lines which are approximately on a 45° angle relative to the vertical lines of the scattering bars 92. In other words, in the given embodiment, the chamfer 91 comprises two right triangles positioned side-to-side. Of course, the chamfer 91 can also be utilized to connect scattering bars disposed parallel to one another in the horizontal direction. As shown below in FIG. 15, the use of the angled chamfer to couple scattering bars extending in a parallel direction allows for the overall scattering bar to more closely conform to the edge of the feature to be printed. It is noted that the use of the chamfer of the present invention can be formed with more predictable results as compared to the "corner touching" contacts shown in FIG. 12*b*, and therefore exhibits reduced issues associated with die-to-data base inspection.

FIGS. 13*a* and 13*b* illustrate how the chamfer scattering bar of the present invention can be adjusted to optimize printing performance. FIG. 13*a* illustrates the same chamfer as disclosed above in FIG. 11, wherein the chamfer 76 is formed of a right triangle having 45°, 45°, and 90° angles. FIG. 13*b* illustrates a variation thereof in which the chamfer 95 has a substantially trapezoidal configuration with both of the parallel lines are approximately on a 45° angle relative to the vertical and horizontal scattering bars.

Figure 15A:
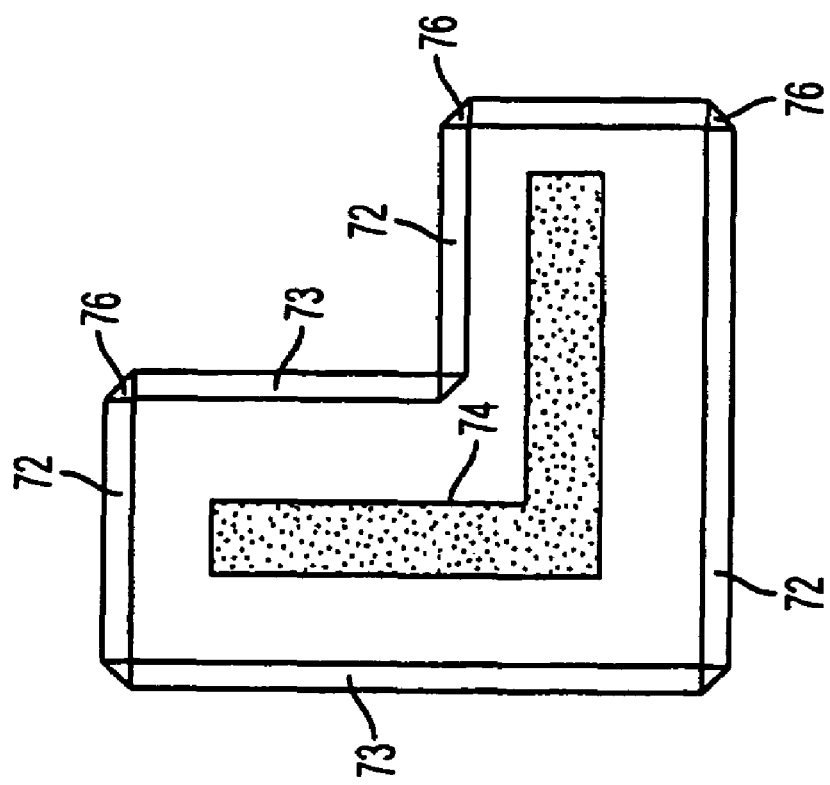
FIGS. 15a and 15b illustrate how the chamfer scattering bars shown in FIGS. 13a and 13b, respectively, can be utilized in combination with horizontal and vertical scattering bars to enclose a feature to be printed.
Figure 15B:
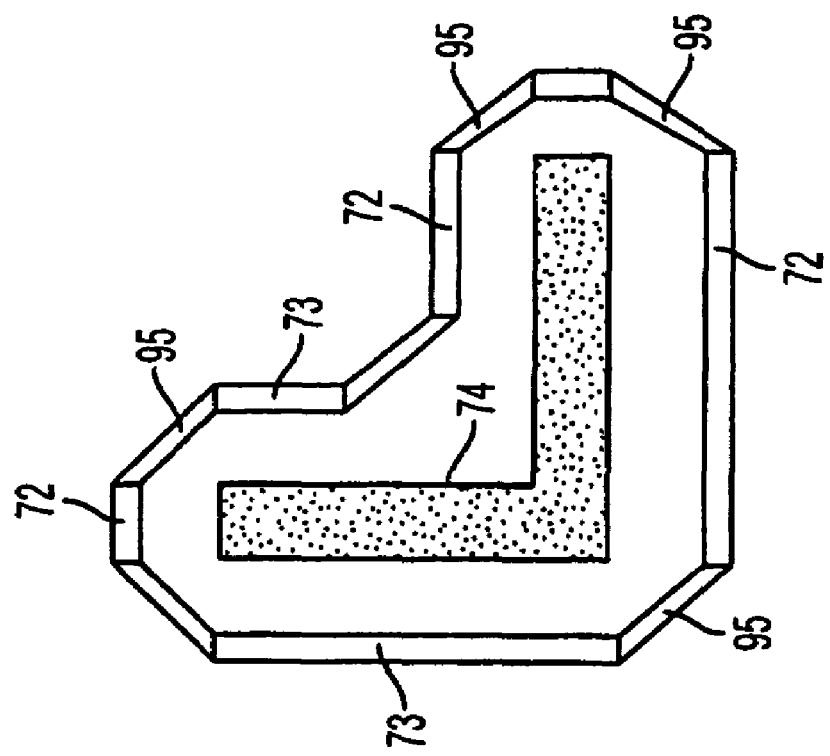

It is noted that the use of the longer chamfer such as shown in FIG. 13*b* (as opposed to the chamfer shown in FIG. 13*a*) may be preferred in certain situations as it may be easier to inspect on the mask due to the longer length. For surrounding outside corners, assuming a circularly symmetric printing system, the ideal scattering bar would be an arc-shaped scattering bar that maintains a constant distance from the primary feature. This ideal scattering bar can be approximated reasonably with 45-degree chamfers such as shown in FIG. 15*b*.

Figure 14B:
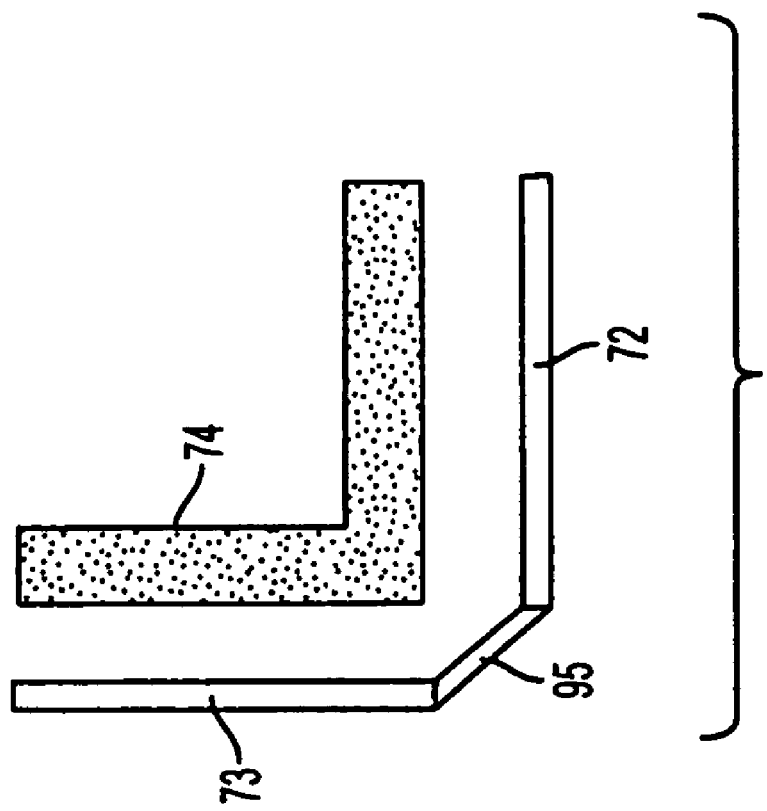
FIGS. 14a and 14b illustrate how the chamfers illustrated in FIGS. 13a and 13b, respectively, can be utilized to cover outside corners of a feature.
Figure 14A:
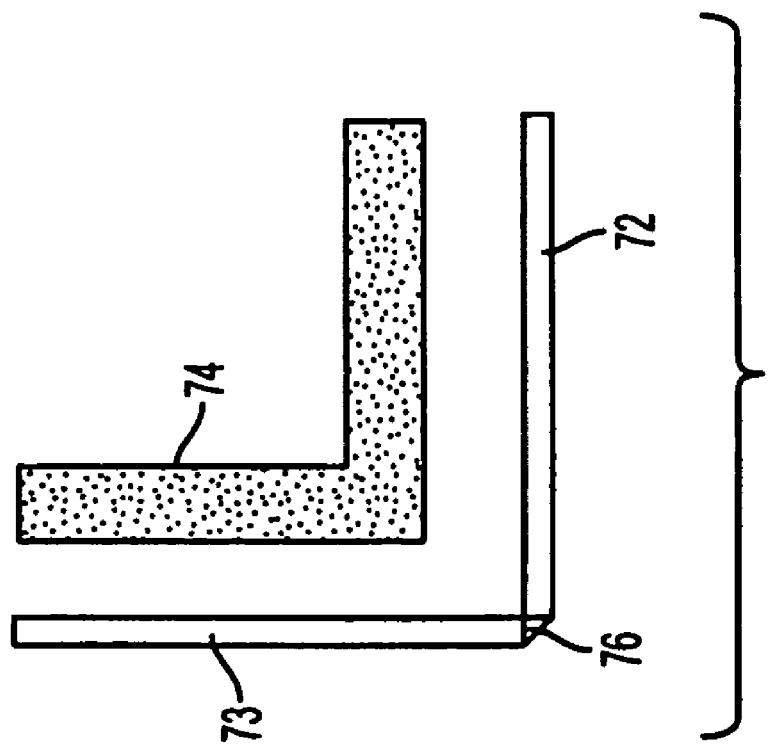

While the chamfers shown in FIGS. 13*a* and 13*b* are utilized to improve imaging of inside corners of features in the target layout, it is also possible to utilize the chamfers to cover outside corners of features in the layout. FIGS. 14*a* and 14*b* illustrate how the chamfers illustrated in FIGS. 13*a* and 13*b*, respectively, can be utilized to cover outside corners of a feature.

Further, as a result of the novel chamfer scattering bar, it is now also possible to fully enclose isolated features with scattering bars. FIGS. 15*a* and 15*b* illustrate how the chamfer scattering bars shown in FIGS. 13*a* and 13*b* can be utilized in combination with horizontal and vertical scattering bars to enclosed a feature to be printed. It is also noted that a combination of the chamfer scattering bars illustrated in FIGS. 13*a* and 13*b* can be utilized to enclose a given feature.

Figure 16:
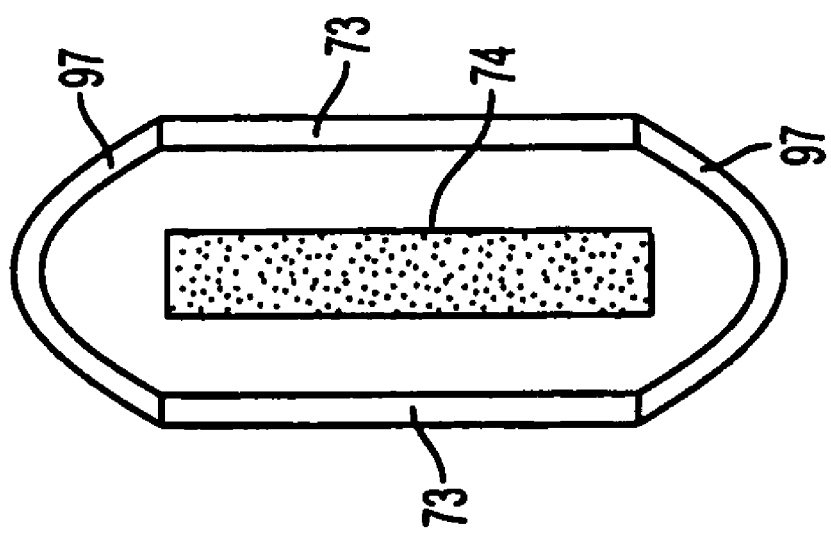
FIG. 16 illustrates another embodiment of the chamfer scattering bar of the present invention.

Yet another variation of the chamfer scattering bar is shown in FIG. 16. Referring to FIG. 16, the chamfer 97 is substantially arcuate (e.g., a semicircular configuration) and allows for line ends or corners of vertical and horizontal scattering bars to be connected. As shown in FIG. 16, the chamfers 97 are utilized to couple two vertical scattering bars 73 together so as to enclose the feature 74.

As noted above, the method and techniques of the present invention for forming scattering bars provides significant advantages over the prior art techniques. One advantage is that the technique of the present invention decreases the amount of individual scattering bars included in the layout design, and increases the overall area occupied by the scattering bars. In addition, the method of the present invention provides for placement of scattering bars at line ends, which would be omitted utilizing prior art techniques. This results in a simplification of the mask making process, while simultaneously improving printing performance. The method also allows for the use of a novel "chamfer" scattering bar which allows for the connection of adjacent vertical and horizontal scattering bars and thereby provides improved printing performance of corner features contained in the layout, as well as full protection (i.e., completely surrounded by scattering bars) of isolated features, as well as maximum defocus protection for the features. This complete surround assures that all parts of these design features receive the depth of focus improvement that scattering bars are known to provide to isolated features.

It is noted that the method of the present invention can be implemented in software such that the foregoing methods disclosed herein are automatically performed during the mask generation process. It is further noted that while not expressly described herein, the process of identifying the areas of intersections between the extended vertical and horizontal scattering bars and the subsequent deletion thereof from the mask design would be well known to those of skill in the art. As such, a further description of that process is not provided herein. Further, it is noted that scattering bars are not placed adjacent every feature edge in the design. For example, features which are densely packed within the target design typically would not be candidates for placement of scattering bars adjacent thereto.

Figure 17:
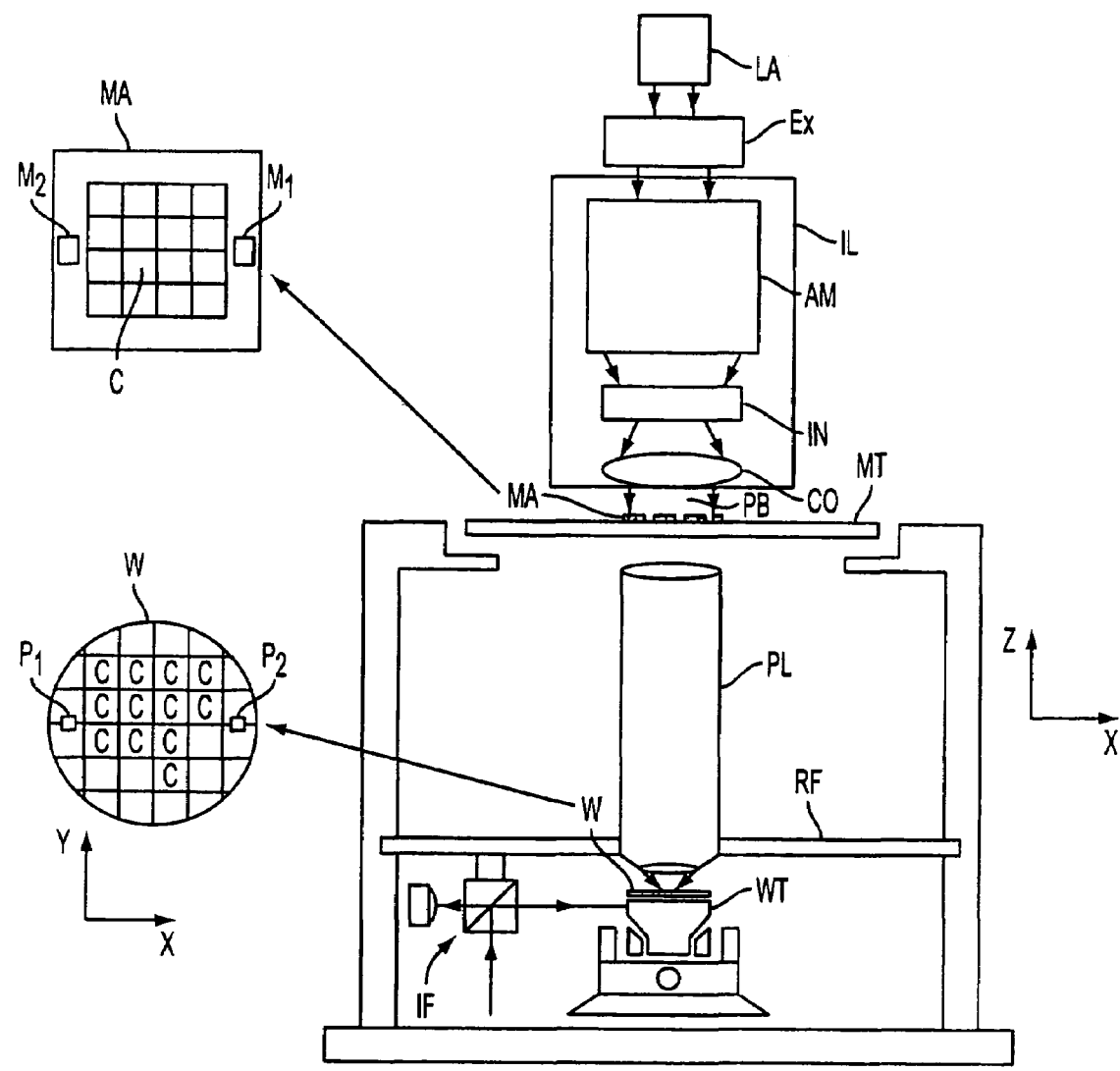
FIG. 17 schematically depicts a lithographic projection apparatus suitable for use with a mask designed with the aid of the current invention.

FIG. 17 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g. a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 17 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g.; based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 17. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-Wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming a mask containing a target pattern comprising features to be imaged, said method comprising the steps of:
    (a) obtaining said target pattern comprising features to be imaged;
    (b) expanding the width of said features to be imaged;
    (c) modifying said mask to include assist features, said assist features being placed adjacent edges of said features to be imaged, said assist features having a length corresponding to the expanded width of said features to be imaged; and
    (d) reducing the features to be imaged from the expanded width to a width corresponding to the target pattern;
    wherein said mask includes said assist features and said features to be imaged, said features to be imaged having said width corresponding to said target pattern.

2. The method of forming a mask according to claim 1, wherein step (b) and step (c) further comprise the steps of:
    expanding the width of said features to be imaged in a first direction by a predetermined amount;
    modifying said mask to include horizontally aligned assist features which are disposed adjacent horizontal edges formed by said expanded features in a first direction;
    expanding the width of said features to be imaged in a second direction by a predetermined amount; and
    modifying said mask to include vertically aligned assist features which are disposed adjacent vertical edges formed by said expanded features in a second direction, said first direction and said second direction being orthogonal to one another.

3. The method of forming a mask according to claim 2, further comprising the step of canceling any portion of said horizontally aligned assist features that overlap with said vertically aligned assist features from said mask, and canceling any portion of said vertically aligned assist features that overlap with said horizontally aligned assist features from said mask.

4. The method of forming a mask according to claim 1, wherein said assist features are subresolution such that said assist features do not print when said mask is imaged.

5. The method of forming a mask according to claim 2, wherein a single, continuous vertically aligned assist feature is disposed proximate line ends of horizontally aligned features that are disposed adjacent one another.

6. The method of forming a mask according to claim 2, wherein a single, continuous horizontally aligned assist feature is disposed proximate line ends of vertically aligned features that are disposed adjacent one another.

7. A program product, comprising executable code transportable by at least one machine readable medium, wherein execution of the code by at least one programmable computer causes the at least one programmable computer to perform a sequence of steps for forming a mask for optically transferring a pattern formed in said mask onto a substrate, said steps comprising:
    (a) obtaining a target pattern comprising features to be imaged;
    (b) expanding the width of said features to be imaged;
    (c) modifying said mask to include assist features, said assist features being placed adjacent edges of said features to be imaged, said assist features having a length corresponding to the expanded width of said features to be imaged; and (d) reducing the features to be imaged from the expanded width to a width corresponding to the target pattern;

wherein said mask includes said assist features and said features to be imaged, said features to be imaged having said width corresponding to said target pattern.

8. The program product according to claim 7, wherein step (b) and step (c) further comprise the steps of:

expanding the width of said features to be imaged in a first direction by a predetermined amount;

modifying said mask to include horizontally aligned assist features which are disposed adjacent horizontal edges formed by said expanded features in a first direction;

expanding the width of said features to be imaged in a second direction by a predetermined amount; and modifying said mask to include vertically aligned assist features which are disposed adjacent vertical edges formed by said expanded features in a second direction, said first direction and said second direction being orthogonal to one another.

9. The program product according to claim 8, further comprising the step of canceling any portion of said horizontally aligned assist features that overlap with said vertically aligned assist features from said mask, and canceling any portion of said vertically aligned assist features that overlap with said horizontally aligned assist features from said mask.

10. The program product according to claim 7, wherein said assist features are subresolution such that said assist features do not print when said mask is imaged.

11. The program product according to claim 8, wherein a single, continuous vertically aligned assist feature is disposed proximate line ends of horizontally aligned features that are disposed adjacent one another.

12. The program product according to claim 8, wherein a single, continuous horizontally aligned assist feature is disposed proximate line ends of vertically aligned features that are disposed adjacent one another.

* * * * *